United States Patent
Han et al.

(10) Patent No.: US 11,670,599 B2
(45) Date of Patent: Jun. 6, 2023

(54) PACKAGE COMPRISING PASSIVE DEVICE CONFIGURED AS ELECTROMAGNETIC INTERFERENCE SHIELD

(71) Applicant: QUALCOMM Incorporated, San Diego, CA (US)

(72) Inventors: Jeahyeong Han, San Diego, CA (US); David Fraser Rae, San Diego, CA (US); Rajneesh Kumar, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/925,217

(22) Filed: Jul. 9, 2020

(65) Prior Publication Data

US 2022/0013472 A1  Jan. 13, 2022

(51) Int. Cl.
    *H01L 23/552* (2006.01)
    *H01L 23/31* (2006.01)
    *H01L 23/64* (2006.01)

(52) U.S. Cl.
    CPC ........ *H01L 23/552* (2013.01); *H01L 23/3121* (2013.01); *H01L 23/647* (2013.01)

(58) Field of Classification Search
    None
    See application file for complete search history.

(56) References Cited

U.S. PATENT DOCUMENTS

| | | | | |
|---|---|---|---|---|
| 4,174,419 A * | 11/1979 | Nienart | ................ | B32B 15/043 |
| | | | | 428/920 |
| 7,038,572 B2 * | 5/2006 | Huber | ...................... | H01C 1/01 |
| | | | | 338/239 |
| 2002/0114134 A1 * | 8/2002 | Skinner | .................. | H01L 23/36 |
| | | | | 361/704 |
| 2002/0130762 A1 * | 9/2002 | Huber | ..................... | H01C 1/01 |
| | | | | 338/320 |
| 2017/0062352 A1 * | 3/2017 | Choi | ...................... | H01L 23/66 |
| 2020/0058599 A1 | 2/2020 | Okada et al. | | |

FOREIGN PATENT DOCUMENTS

| | | |
|---|---|---|
| KR | 20130074869 A | 7/2013 |
| TW | I624915 B | 5/2018 |

OTHER PUBLICATIONS

Partial International Search Report—PCT/US2021/034914—ISA/EPO—dated Aug. 26, 2021.
International Search Report and Written Opinion—PCT/US2021/034914—ISA/EPO—dated Nov. 16, 2021.

\* cited by examiner

*Primary Examiner* — Bo B Jang
(74) *Attorney, Agent, or Firm* — Loza & Loza, LLP/Qualcomm

(57) ABSTRACT

Packages are configured to include an electromagnetic interference (EMI) shield. According to one example, a package includes a substrate, an electrical component, and an EMI shield. The substrate includes a first surface and a second surface. The electrical component may be coupled to the first side of the substrate. The EMI shield is formed with at least one passive device. The at least one passive device is coupled to the first surface of the substrate. The at least one passive device is located laterally to the at least one electrical component, and extends along at least a portion of the electrical component. Other aspects, embodiments, and features are also included.

24 Claims, 17 Drawing Sheets

TOP PLAN VIEW

PROFILE VIEW

PROFILE VIEW

TOP PLAN VIEW

TOP PLAN VIEW 11-11 CROSS SECTION

PROFILE VIEW

*PROFILE VIEW*

PROFILE VIEW

PACKAGE COMPRISING PASSIVE DEVICE CONFIGURED AS ELECTROMAGNETIC INTERFERENCE SHIELD

TECHNICAL FIELD

Various features relate to packages that include an integrated device, but more specifically to a package that includes an integrated device, a substrate, and a passive device configured as an electromagnetic interference shield coupled to the substrate.

INTRODUCTION

Electronic devices general emit electromagnetic radiation. Such electromagnetic radiation can prevent nearby electronic components from functioning correctly. This is typically called electromagnetic interference (EMI). FIG. 1 illustrates a package 100 that includes a substrate 102, an electrical component 104, and a metal frame 106 coupled to the substrate 102. The metal frame 106 is configured as an EMI shield to prevent electromagnetic radiation from interfering with the electrical component 104.

FIG. 2 illustrates a package 200 that includes a substrate 202, the electrical component 104, an electrical component 204, a metal frame 206a and a metal frame 206b. The electrical component 104, the electrical component 204, the metal frame 206a and the metal frame 206b are coupled to the substrate 202. The metal frame 206a covers the electrical component 104 and provide EMI shielding for the electrical component 104. The metal frame 206b covers the electrical component 204 and provides EMI shielding for the electrical component 204.

The above solutions are relatively expensive, adding to the cost of manufacturing electronic devices. There is an ongoing need to provide efficient EMI shielding that facilitates lower costs and efficient construction and placement, among other advantages.

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various features relate to packages that include an EMI shield, but more specifically to a package that includes a substrate, at least one electrical component and an EMI shield formed with at least one passive device.

One example provides a package that includes a substrate, an electrical component, and a plurality of passive devices. The substrate includes a first surface and a second surface opposite to the first surface. The at least one electrical component is coupled to the first surface of the substrate. The plurality of passive devices is coupled to the first surface of the substrate and located laterally to the at least one electrical component. The plurality of passive devices forms an electromagnetic interference (EMI) shield.

Another example provides an apparatus that includes a substrate, an electrical component, and a means for electromagnetic interference (EMI) shielding through at least one passive device. The substrate includes a first surface and a second surface opposite to the first surface. The at least one electrical component is coupled to the first surface of the substrate. The at least one passive device is coupled to the first surface of the substrate. The at least one passive device is located laterally to the at least one electrical component.

Another example provides a method for fabricating a package. The method provides a substrate comprising a first surface and a second surface, where the substrate further includes a plurality of interconnects. The method couples at least one electrical component to one or more interconnects of the plurality of interconnects of the substrate. The method couples at least one passive device to one or more interconnects of the plurality of interconnects of the substrate, where the at least one passive device forms at least a portion of an electromagnetic interference (EMI) shield.

These and other aspects of the disclosure will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The illustrations presented herein are, in some instances, not actual views of any particular package or apparatus, but are merely idealized representations which are employed to describe the present disclosure. Additionally, elements common between figures may retain the same numerical designation.

The present disclosure describes a package that includes a substrate, at least one electrical component, and an electromagnetic interference (EMI) shield formed by one or more passive devices. The passive devices may be coupled to a first surface of the substrate. The EMI shield may provide compartmental shielding and/or package edge shielding for the package. Using one or more passive devices may provide a cost effective way of providing an EMI shield for the package, since the passive devices have already been designed and the one or more passive devices configured as an EMI shield may be placed on the substrate during the same process as placing other passive devices (that are not configured as an EMI shield), which may reduce the number of steps in the fabrication process of the package. Moreover, using passive devices as part of an EMI shield provides added flexibility in designing the EMI shield for the package.

Figure 1:
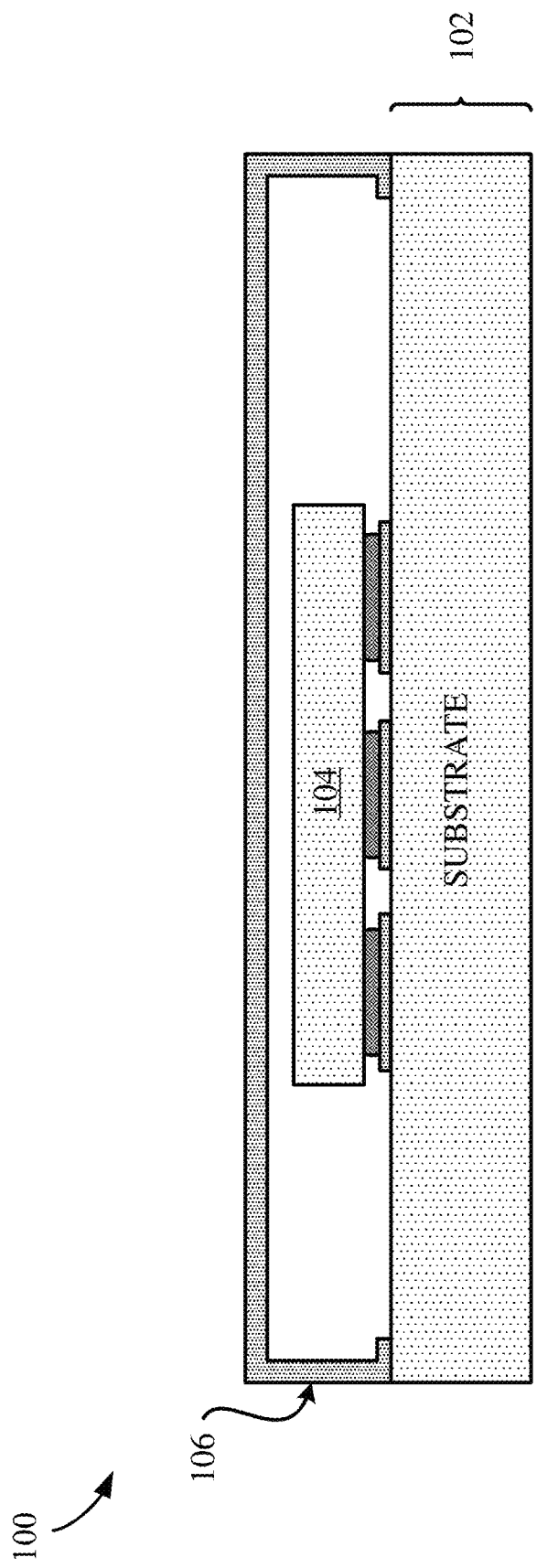
FIG. 1 illustrates a profile view of a package that includes an electrical component, an EMI shield, and a substrate.
Figure 2:
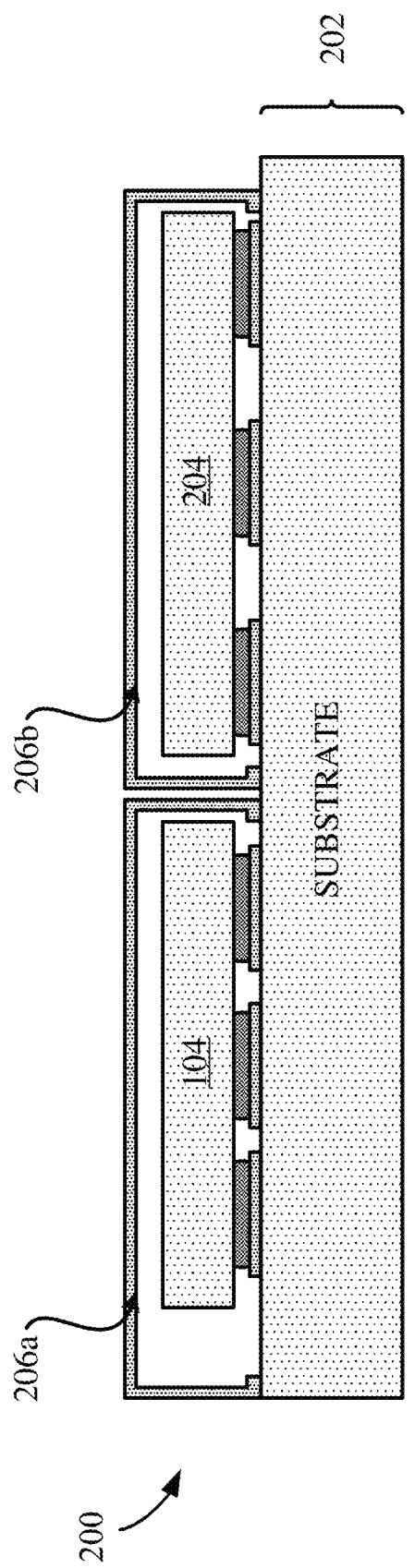
FIG. 2 illustrates a profile view of a package that includes an electrical component, an EMI shield, and a substrate.
Figure 3:
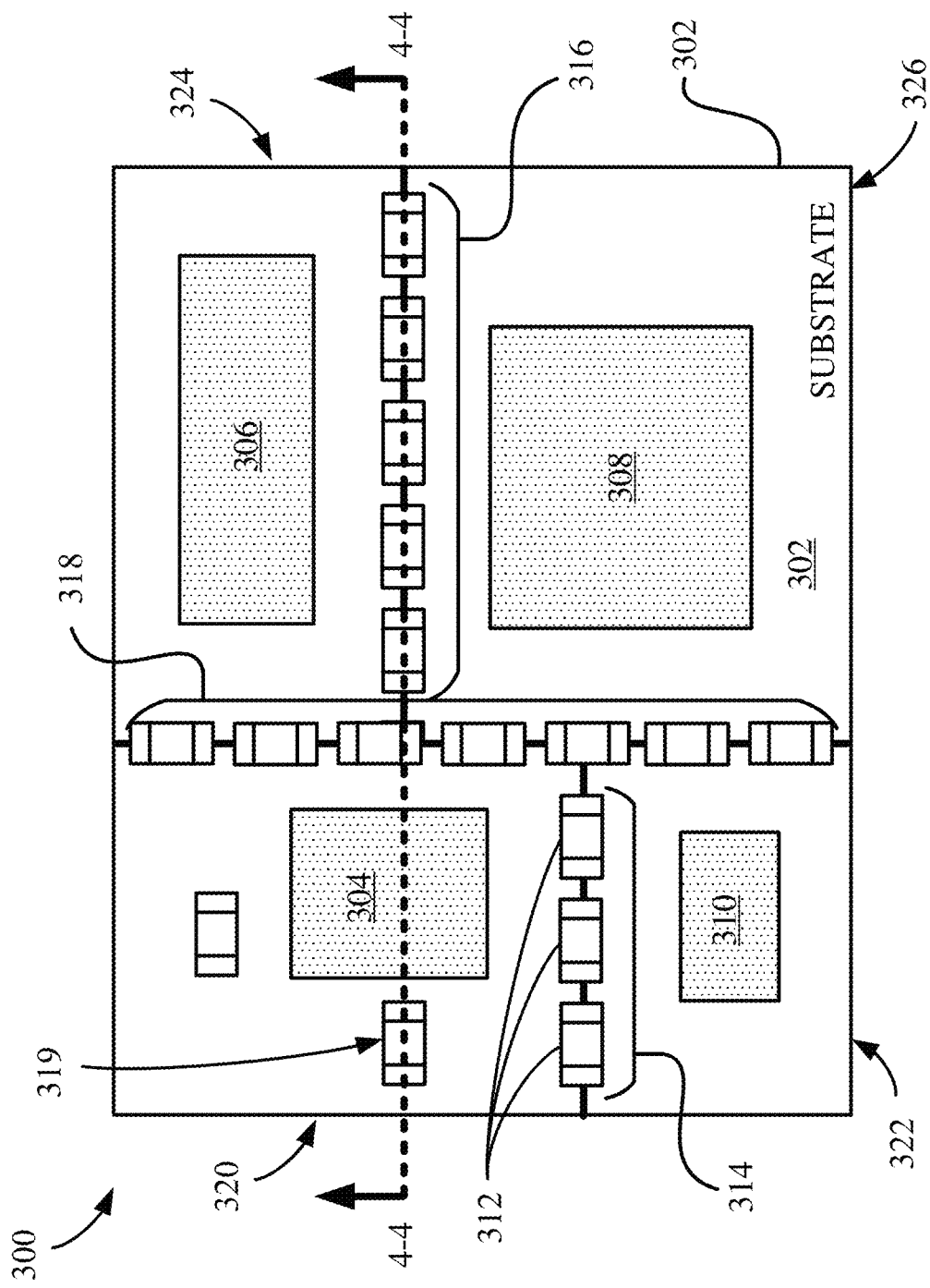
FIG. 3 illustrates a plan view of a package that includes an EMI shield wall formed by one or more passive devices.

Exemplary Package Including at Least One Passive Device Configured as an Electromagnetic Interference (EMI) Shield Aspects of the present disclosure include packages with passive devices configured as at least one electromagnetic interference (EMI) shield. FIG. 3 illustrates a plan view of a package 300 that includes an EMI shield formed by one or more passive devices. The package 300 includes a substrate 302, one or more electrical components 304, 306, 308, 310 located over the substrate 302, and at least one EMI shield (e.g., 314, 316, 318) formed with one or more passive devices 312 coupled to and located over the substrate 302 and extending along at least a portion of the one or more electrical components 304, 306, 308, 310. The package 300 may also include an encapsulation layer (which is further described below in FIG. 4). The EMI shield 314 is located laterally to the electrical components 304 and 310, and located along a portion of the electrical component 304 and the electrical component 310. Similarly, the EMI shield 316 is located laterally to the electrical components 306 and 308, and coupled to extend along a portion of each of the electrical component 306 and the electrical component 308. The EMI shield 314, the EMI shield 316, and the EMI shield 318 may be configured as at least one compartmental EMI shield for the package 300. The EMI shield 314, the EMI shield 316 and/or the EMI shield 318 may help prevent signals from the electrical components 304, 306, 308 and/or 310 from interfering with one another. The EMI shield 314, the EMI shield 316 and/or the EMI shield 318 may help prevent signals from external components from interfering with the electrical components 304, 306, 308 and/or 310. Likewise, the EMI shield 314, the EMI shield 316 and/or the EMI shield 318 may help prevent signals from the electrical components 304, 306, 308 and/or 310 from interfering with external components. The EMI shield(s) 314, 316, and/or 318 may be means for electromagnetic interference (EMI) shielding. For example, the means for EMI shielding may be provided through at least one passive device (e.g., 312). The EMI shield 314, the EMI shield 316, and/or the EMI shield 318 may subdivide the package 300 into several compartments (e.g., 320, 322, 324, 326), where one or more particular compartment may help isolate an electrical component from signals from other electrical components and/or or external signals. The EMI shield(s) 314, 316 and/or 318 may be an EMI shield wall (e.g., compartmental EMI shield wall). The EMI shield(s) 314, 316, and/or 318 may be separate or part of the same EMI shield. As shown in FIG. 3, the package 300 may also include at least one passive device 319 that is not configured to operate as an EMI shield for the package 300. The at least one passive device 319 may be coupled to the substrate 302. The at least one passive device 319 may be configured to be electrically coupled to one or more of the electrical components 304, 306, 308, and/or 310.

Figure 4:
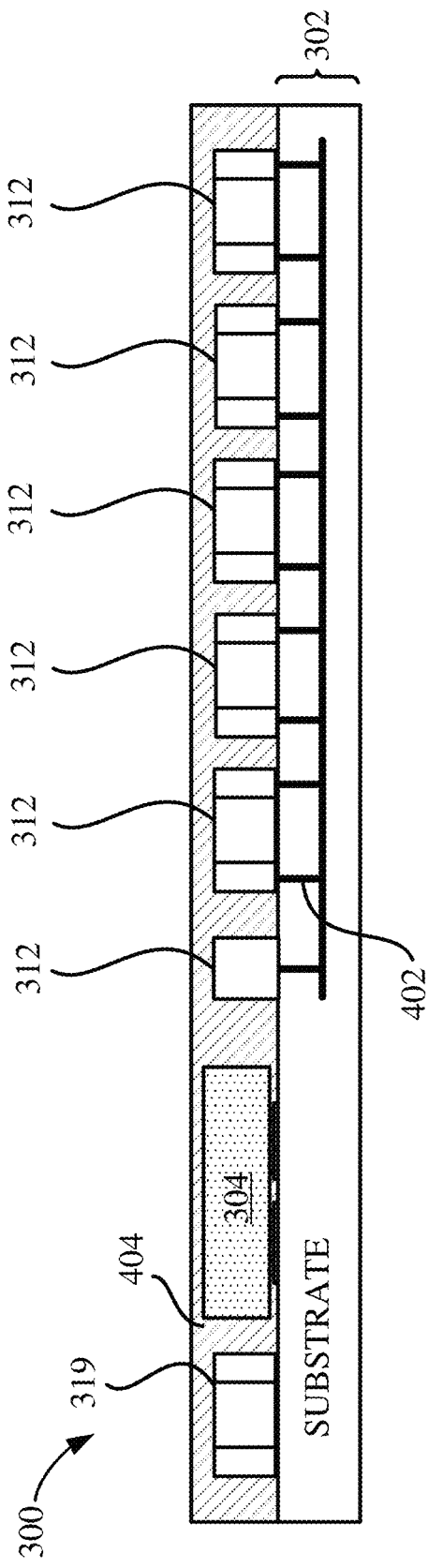
FIG. 4 illustrates a profile view of the package in FIG. 3 according to at least one embodiment cross-sectioned along the line 4-4 in FIG. 3.

FIG. 4 shows a profile view of the package 300 according to at least one embodiment cross-sectioned along the line 4-4 in FIG. 3. As shown, the substrate 302 includes a first surface (e.g., top surface) and an opposing second surface (e.g., bottom surface). Although the depicted example refers to the first surface as the top surface, it should be understood that the first surface may refer to the top surface in some examples and to the bottom surface in other examples. Similarly, the second surface may refer to the bottom surface in some examples and to the top surface in other examples. The substrate 302 may be a laminate substrate, a coreless substrate, an organic substrate, a substrate that includes a core layer, etc. The electrical component 304 is located over the first surface of the substrate 302. The electrical component 304 (or any of the electrical components in the disclosure) is depicted as an integrated circuit (IC) die, but it should be understood that the electrical component 304 may be any electrical component that generates EMI and/or is sensitive to EMI. For example, an electrical component may include an integrated device, a processor, a memory, a filter, a transmitter, a receiver, and/or combinations thereof. An integrated device may include a die (e.g., bare die). The integrated device may include a radio frequency (RF) device, an analog device, a passive device, a filter, a capacitor, an inductor, an antenna, a transmitter, a receiver, a surface acoustic wave (SAW) filters, a bulk acoustic wave (BAW) filter, a light emitting diode (LED) integrated device, a Silicon (Si) based integrated device, a silicon carbide (SiC) based integrated device, a GaAs based integrated device, a GaN based integrated device, a memory, power management processor, and/or combinations thereof. The package 300 may be implemented as part of a radio frequency front end (RFFE) package, such as a millimeter wave RFFE package. The package 300 and/or any of the packages described may be implemented in an electronic device (e.g., mobile phone).

Figure 5:
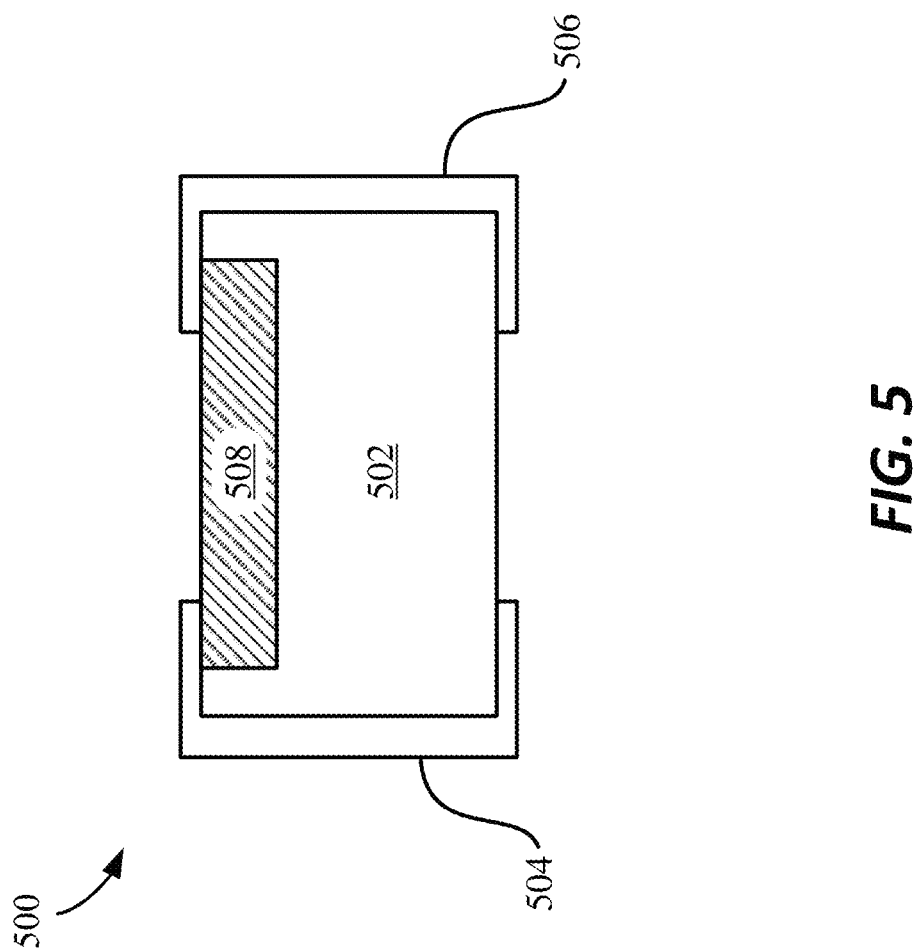
FIG. 5 illustrates an exemplary block diagram of a resistor according to at least one embodiment.

As shown, each of the one or more passive devices 312 is coupled to and located on the first surface of the substrate 302. A passive device may generally include any electronic device or component that is incapable of controlling current by means of another electrical signal (e.g., resistors, capacitors). In some embodiments, a passive device 312 may be a conductive passive device, a conventional resistor (e.g., surface-mount resistor, axial lead resistor), and/or a die configured as a resistor. A die that is configured as a resistor may include a substrate (e.g., silicon, glass, quartz) and at least one interconnect located over the substrate. Referring to FIG. 5, a block diagram of a resistor is shown according to at least one embodiment. As shown, the resistor 500 may generally include a ceramic body 502 with a first longitudinal end (e.g., a left side) and a second longitudinal end (e.g., a right side). A first conductive contact 504 (e.g., a first terminal) is located adjacent to the first longitudinal end (e.g., the left side) of the body 502, and a second conductive contact 506 (e.g., a second terminal) is located adjacent to the second longitudinal end (e.g., the right side) of the body 502. A resistive element 508 extends between, and is electrically connected with the first conductive contact 504 and the second conductive contact 506. The resistive element 508 may be selected so that the resistor 500 may have a specific resistance rating (e.g., in terms of ohms). The resistive element 508 may include a conductive element (e.g., electrically conductive element). This may be the case when the resistive element 508 is configured to be rated as a low-ohm resistor and/or a zero (0) ohm resistor. For a low-ohm resistor and/or a zero (0) ohm resistor, the resistive element 508 may include a very low resistance and behave more like an electrically conductive element. The resistor 500 may be a means for resistance. Although a generic block diagram of a resistor structure is depicted in FIG. 5, those of ordinary skill in the art will understand that a resistor may include varying structures according to different embodiments of the present disclosure.

In embodiments in which a passive device 312 is configured as a resistor, the resistor(s) may be configured as a low-ohm resistor. For example, a passive device 312 may be a resistor rated with a resistance of 1.000 ohms (1 kilohm) or less. In still other embodiments, a passive device 312 may be a resistor rated with a resistance rating of zero (0) ohms. Resistor ratings may be marked on the resistor using the conventional color code or with a numeric color code. For example, a zero-ohm resistor may be marked with a single black band, with a single "0", or with "000" to indicate that the resistor is rated as a zero-ohm resistor. It should be understood that a zero-ohm resistor may only be approximately zero ohms, and may still have a minimal resistance. An EMI shield that uses passive devices with lower resistance values may perform better than an EMI shield that uses passive devices with a relatively higher resistance value.

Referring again to FIG. 4, the substrate 302 may include a plurality of interconnects 402. The plurality of interconnects 402 may provide at least one electrical path (e.g., electrical connection) between each passive device 312 and a ground, to electrically couple each passive device 312 to the ground. In the depicted example, an interconnect 402 is electrically coupled to each conductive contact (e.g., each terminal) of the passive devices 312. The plurality of interconnects 402 may be located in and over the substrate 302. The plurality of interconnect 402 shown in FIG. 4 may conceptually represent several interconnects, including traces, vias and/or pads. The passive devices 312 may be coupled to surface interconnects and/or embedded interconnects from the plurality of interconnects 402.

In some embodiments, as shown in FIG. 4, an encapsulation layer 404 may be coupled to and located over the first surface (e.g., top surface) of the substrate 302 such that the encapsulation layer 404 encapsulates the electrical components (e.g., electrical component 304) and the passive devices 312. The encapsulation layer 404 may include a mold, a resin, an epoxy and/or polymer. The encapsulation layer 404 may be a means for encapsulation.

As will be further described below in FIGS. 14A-14B, the passive devices 312 (which are configured as an EMI shield) are provided over the substrate 302 before the encapsulation layer 404 is formed. This may reduce the number of steps in the fabrication process of a package, which ultimately may provide a cost-effective way of providing an EMI shield for the package. Using the passive devices 312 as an EMI shield may mean that a metal frame for EMI shielding is not required or that a cavity filled with paste (to form a via for EMI shielding) does not need to be fabricated in the encapsulation layer, reducing the steps and costs for fabricating a package with EMI shielding. Moreover, using passive devices as part of an EMI shield provides added flexibility in designing the EMI shield for the package, since the location, size and/or shape of the passive devices may be changed and/or replaced fairly easily without having to redesign the entire substrate and/or package.

Figure 6:
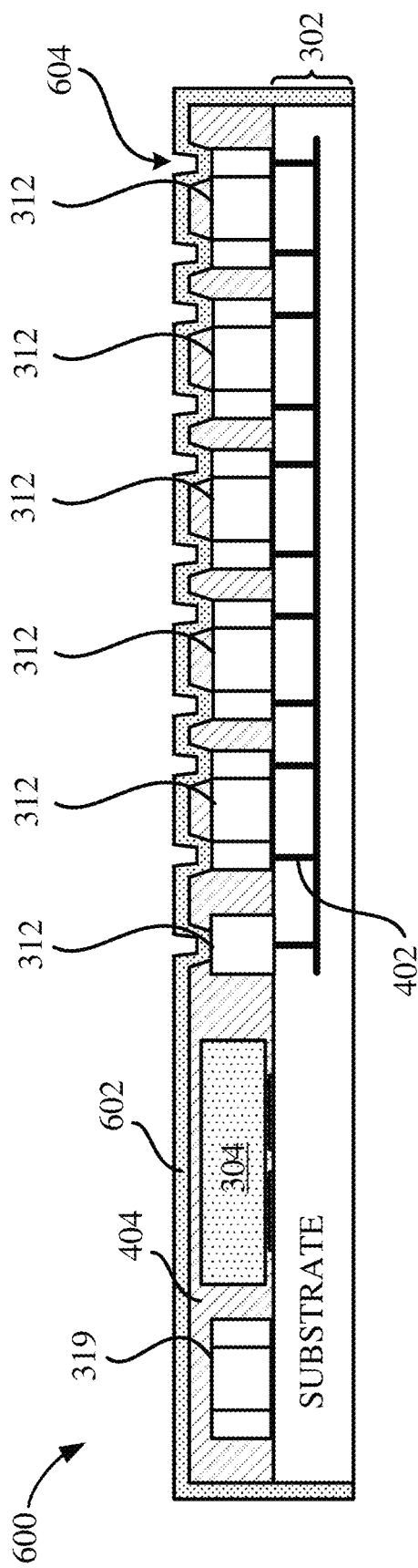
FIG. 6 illustrates a profile view of the package in FIG. 3 with an EMI shield according to at least one embodiment cross-sectioned along the line 4-4 in FIG. 3.

Referring to FIG. 6, one or more embodiments may include a conductive layer 602 disposed over at least a portion of the encapsulation layer 404. FIG. 6 illustrates a package 600 that includes passive devices configured as an EMI shield. The package 600 in FIG. 6 is similar to the package 300 in FIG. 4, and includes similar or the same components as the package 300. The package 600 in FIG. 6 includes the conductive layer 602 disposed over the encapsulation layer 404 and a side surface of the substrate 302. The conductive layer 602 may form an EMI shield (e.g., external EMI shield) over one or more of the electrical components. The conductive layer 602 is an electrically conductive layer. The conductive layer 602 may be configured as a conformal EMI shield for the package 600. A conformal EMI shield may be an EMI shield that provides external EMI shielding for a package. As depicted, a plurality of openings 604 may be formed in the encapsulation layer 404 to one or more conductive contacts (e.g., terminals) of the passive devices 312 to facilitate the conductive layer 602 being electrically coupled with each of the passive devices 312.

Figure 7:
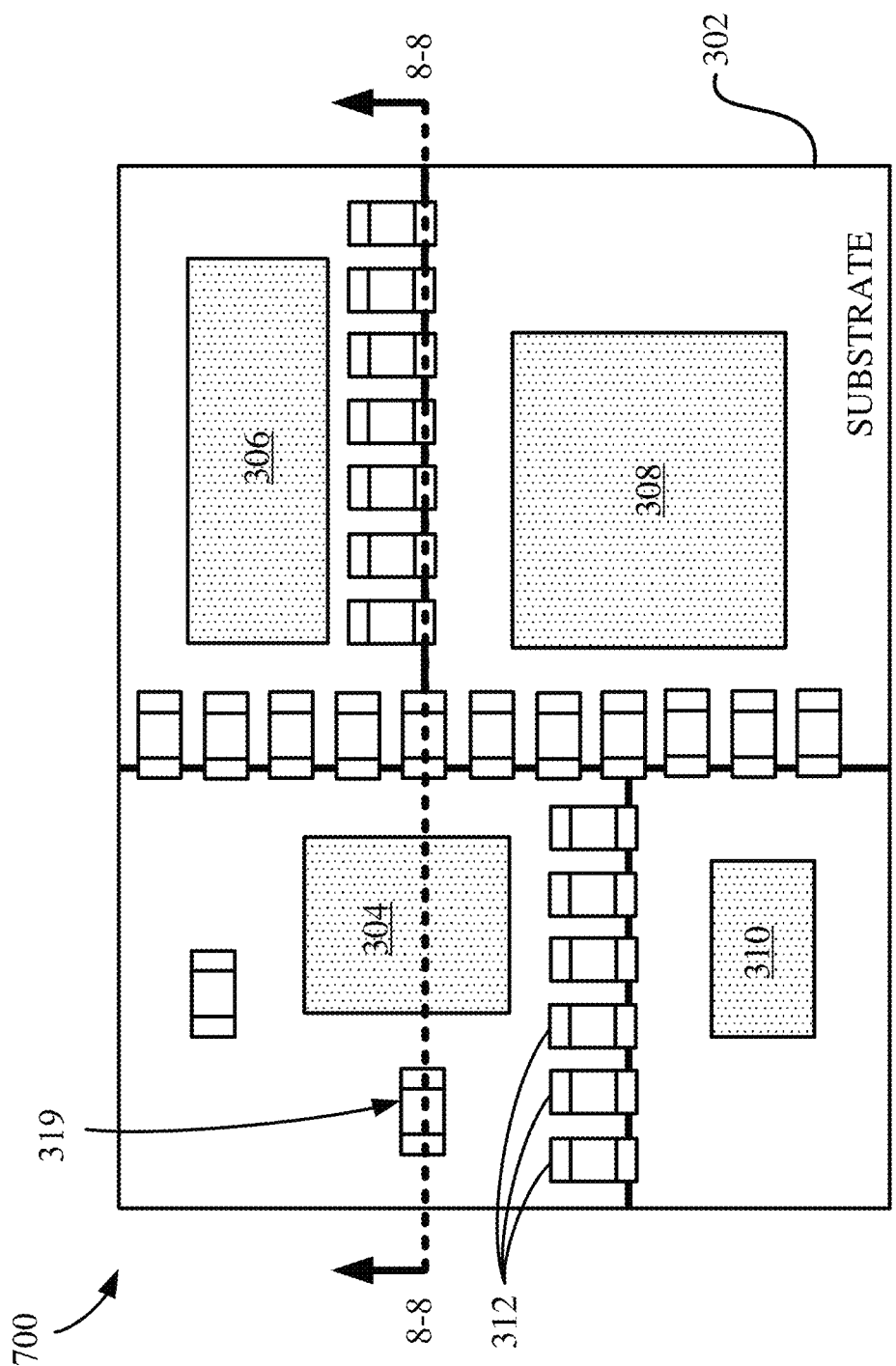
FIG. 7 illustrates a plan view of an embodiment of a package in which the passive devices forming an EMI shield are located with a rotated orientation.
Figure 8:
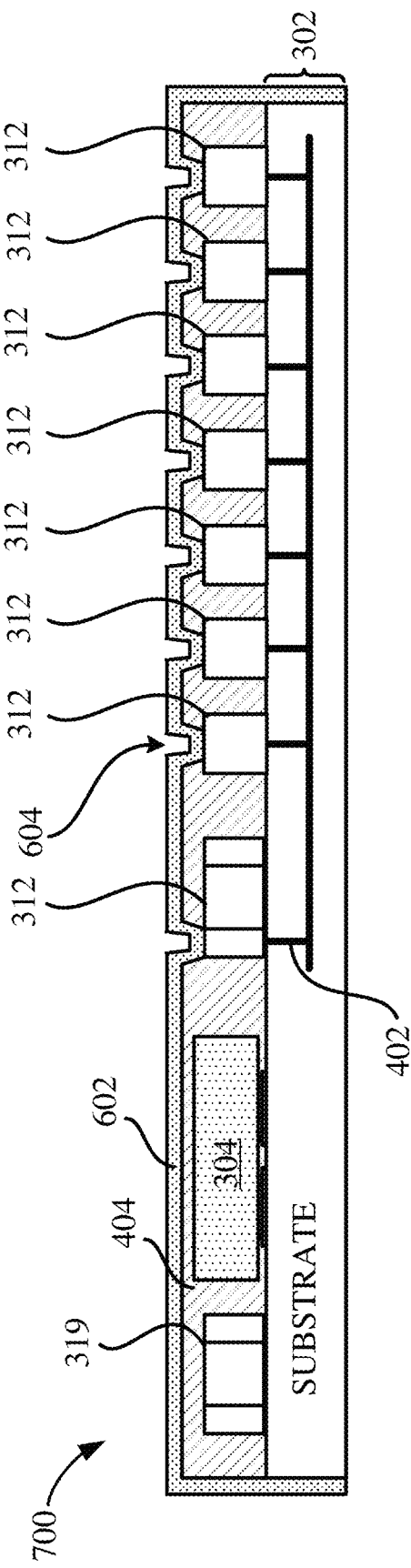
FIG. 8 illustrates a profile view of an example of the package in FIG. 7 according to at least one embodiment cross-sectioned along the line 8-8 in FIG. 7.

In the example in FIG. 3, the passive devices 312 are located with each of two conductive contacts (e.g., terminals) coupled to a ground interconnect. In one or more other embodiments, the passive devices 312 may be located with only a single conductive contact (e.g., terminal) coupled to the ground interconnect. However, the passive devices 312 may be aligned and/or oriented in different directions. FIG. 7 illustrates a plan view of an embodiment of a package 700 in which each of the passive devices 312 is rotated 90° relative to their orientation in FIG. 3. In the depicted example, only one conductive contact (e.g., terminal) for each passive device 312 is connected to an interconnect to electrically connect each passive device 312 to ground. FIG. 8 shows a profile view of an example of the package 700 according to at least one embodiment cross-sectioned along the line 8-8 in FIG. 7. As shown, the substrate 302 includes a plurality of interconnects 402 providing at least one electrical path (e.g., electrical connection) between each passive device 312 and a ground. In the depicted example, an interconnect 402 is electrically coupled to just one conductive contact (e.g., each terminal) of each of the passive devices 312. Additionally, the conductive layer 602 is shown disposed over the encapsulation layer 404 with a plurality of openings 604 formed in the encapsulation layer 404 to just one of the conductive contacts (e.g., terminals) of the passive devices 312 to facilitate the conductive layer 602 being electrically coupled with each of the passive devices 312. Embodiments with just one conductive contact (e.g., terminal) for each passive device 312 connected to a ground interconnect may utilize passive devices 312 configured as resistors, capacitors, or other passive devices.

Figure 9:
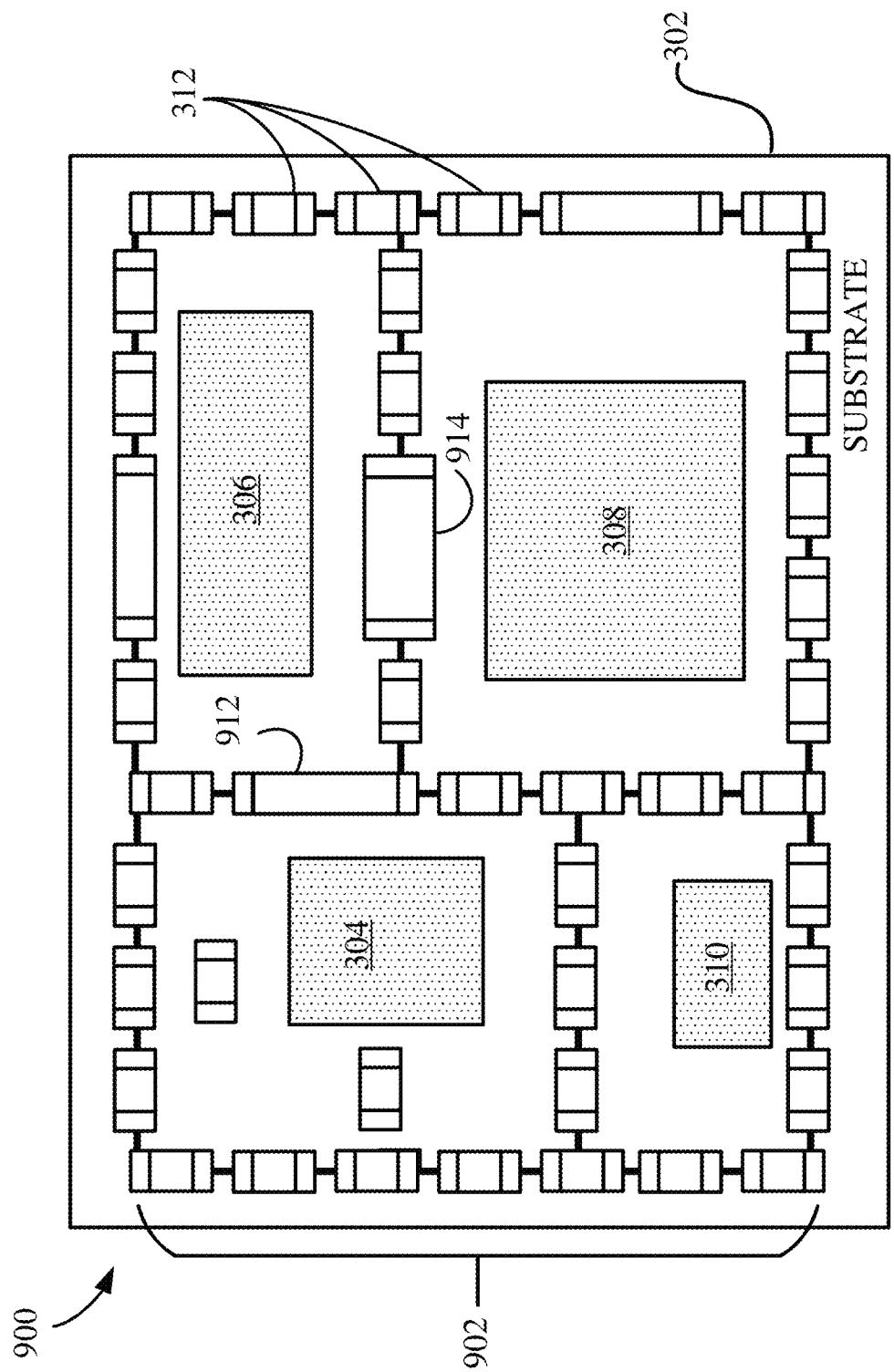
FIG. 9 illustrates a plan view of a package that includes a package edge EMI shield formed by a plurality of passive devices.

In some embodiments, one or more passive devices 312 may be utilized to form a package edge EMI shield. A package edge EMI shield is similar to an EMI shield. However, a package edge EMI shield may be located along a periphery of the substrate and/or the package. A package edge EMI shield may define at least one external EMI shield wall for the package. FIG. 9 illustrates a plan view of a package 900 that includes a package edge EMI shield 902 formed by a plurality of passive devices 312 located along a periphery (e.g., lateral edges) of the substrate 302. In the depicted example, the passive devices 312 form (i) at least one compartmental EMI shield and (ii) a package edge EMI shield. Similar to the other examples, each of the passive devices 312 forming an EMI shield can be coupled to an interconnect to facilitate connecting each passive device 312 to ground. Further, a conductive layer (e.g., electrically conductive layer) may be formed over at least a portion of an encapsulation layer, with the conductive layer coupled to one or more conductive contacts of each passive device 312 through openings formed in the encapsulation layer. FIG. 9 illustrates that passive devices of various sizes and shapes may be used to form an EMI shield and/or a package edge EMI shield. FIG. 9 illustrates a passive device 912 and a passive device 914. The passive device 912 and the passive device 914 may be longer and/or wider than the passive devices 312. The passive device 912 and the passive device 914 may be used (separately and/or in conjunction with the passive devices 312) to form at least one EMI shield for the package 900 (or any of the packages describes in the disclosure). In some implementations, smaller length and/or thinner passive devices may be used to form at least one EMI shield (including package edge EMI shield) for the package 900 (or any of the packages describes in the disclosure).

Figure 10:
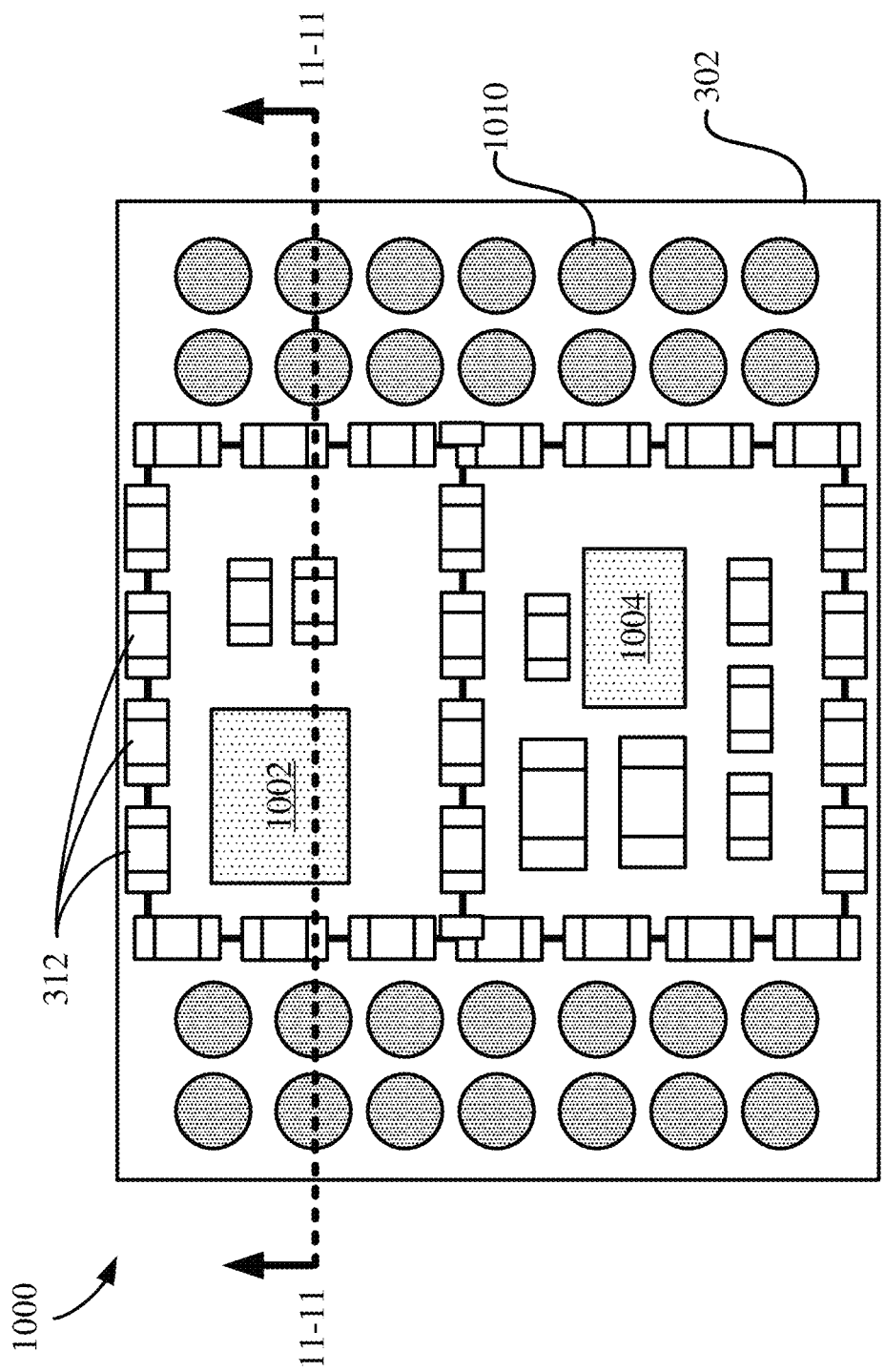
FIG. 10 illustrates a plan view of the second surface (e.g., bottom surface) of a substrate according to at least one embodiment dual-sided package.

In some embodiments, one or more electrical components may also be located on the second surface (e.g., bottom surface) of the substrate 302. Referring now to FIG. 10, a plan view of the second surface (e.g., bottom surface) of the substrate 302 is depicted according to at least one embodiment. FIG. 10 illustrates a bottom view of a package 1000 that includes passive devices configured as an EMI shield. The package 1000 is similar to the packages 300 and 600, and thus may include similar or the same components as the packages 300 and 600. As shown in FIG. 10, the package 1000 includes the substrate 302, the passive devices 312, one or more electrical components 1002, 1004, and a plurality of solder interconnects 1010. The electrical components 1002 and 1004, and the plurality of solder interconnects 1010 may be coupled to the second surface (e.g., bottom surface) of the substrate 302. Additionally, one or more passive devices 312 may be coupled to the second surface of the substrate 302 to form one or more compartmental EMI shields and/or a package edge EMI shield.

Figure 11:
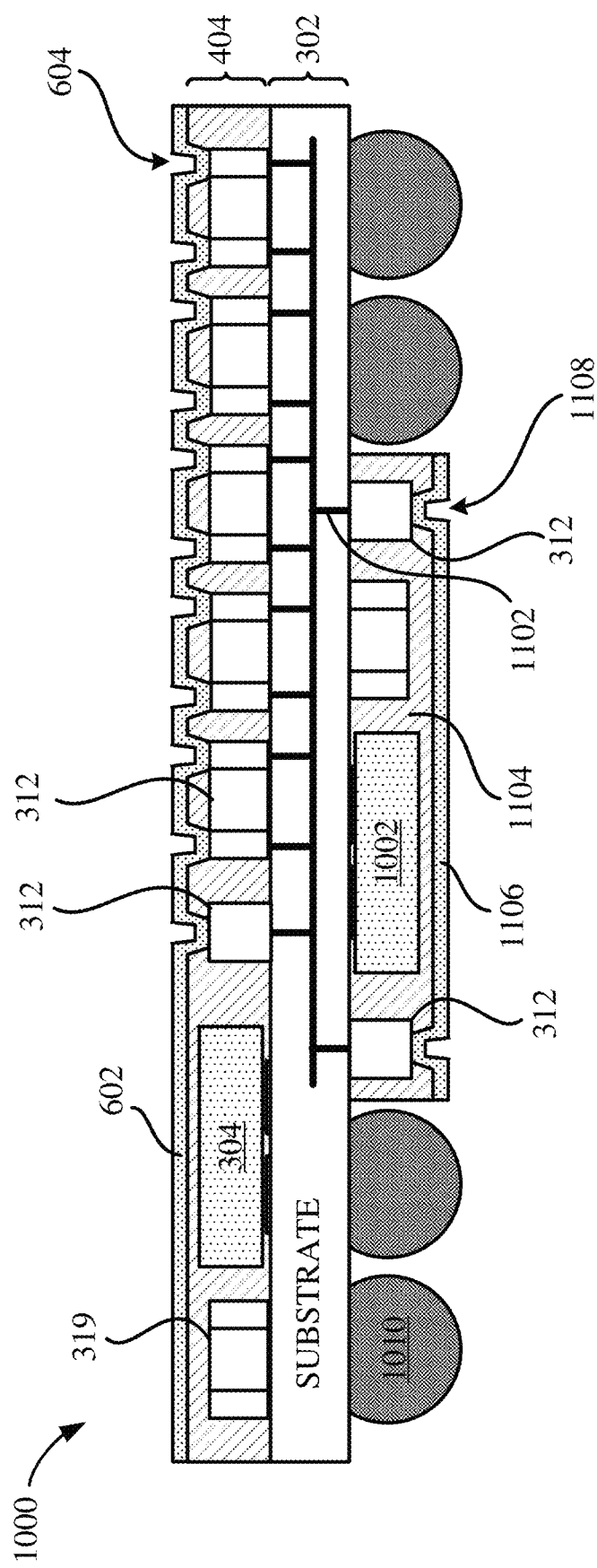
FIG. 11 illustrates a profile view of the package of FIG. 10 according to at least one embodiment cross-sectioned along the line 11-11 in FIG. 10.

FIG. 11 illustrates a profile view of the package 1000 according to at least one embodiment cross-sectioned along the line 11-11 in FIG. 10. As shown in FIG. 11, the package 1000 includes the substrate 302, the electrical component 1002, the encapsulation layer 1104 and a conductive layer 1106, and the plurality of solder interconnects 1010. The electrical component 304 is coupled to and located over the first surface of the substrate 302, and the electrical component 1002 is coupled to and located over the second surface of the substrate 302. Both the first surface and the second surface also include one or more passive devices 312 located thereon. The substrate 302 includes a plurality of interconnects 1102 providing at least one electrical path (e.g., electrical connection) between each passive device 312 and a ground. The plurality of interconnect 1102 shown in FIG. 11 may conceptually represent several interconnects (e.g., traces, vias, pads). Further, an encapsulation layer 404 is disposed over and coupled to the first surface of the substrate 302, while a second encapsulation layer 1104 is disposed over and coupled to the second surface of the substrate 302. The encapsulation layer 404 encapsulates the electrical components (e.g., electrical components 304) and the passive devices 312 on the first surface of the substrate 302. The encapsulation layer 1104 encapsulates the electrical components (e.g., electrical components 1002) and the passive devices 312 on the second surface of the substrate 302.

As discussed above, various embodiments may include a conductive layer 602, 1106 disposed over at least a portion of each encapsulation layer 404, 1104 to form an EMI shield (e.g., conformal EMI shield) over one or more of the electrical components. As depicted, a plurality of openings 604, 1108 are formed in the encapsulation layers 404, 1104 to one or more conductive contacts (e.g., terminals) of the passive devices 312 to facilitate the conductive layers 602, 1106 being electrically connected with the passive devices 312. The conductive layers 602 and 1106 are electrically conductive layers.

In one or more embodiments, the second surface of the substrate 302 may further include a plurality of solder interconnects 1010. The solder interconnects 1010 may be located laterally relative to the electrical components 1002, 1004 and the passive devices 312 coupled to the second surface of the substrate 302.

Figure 12:
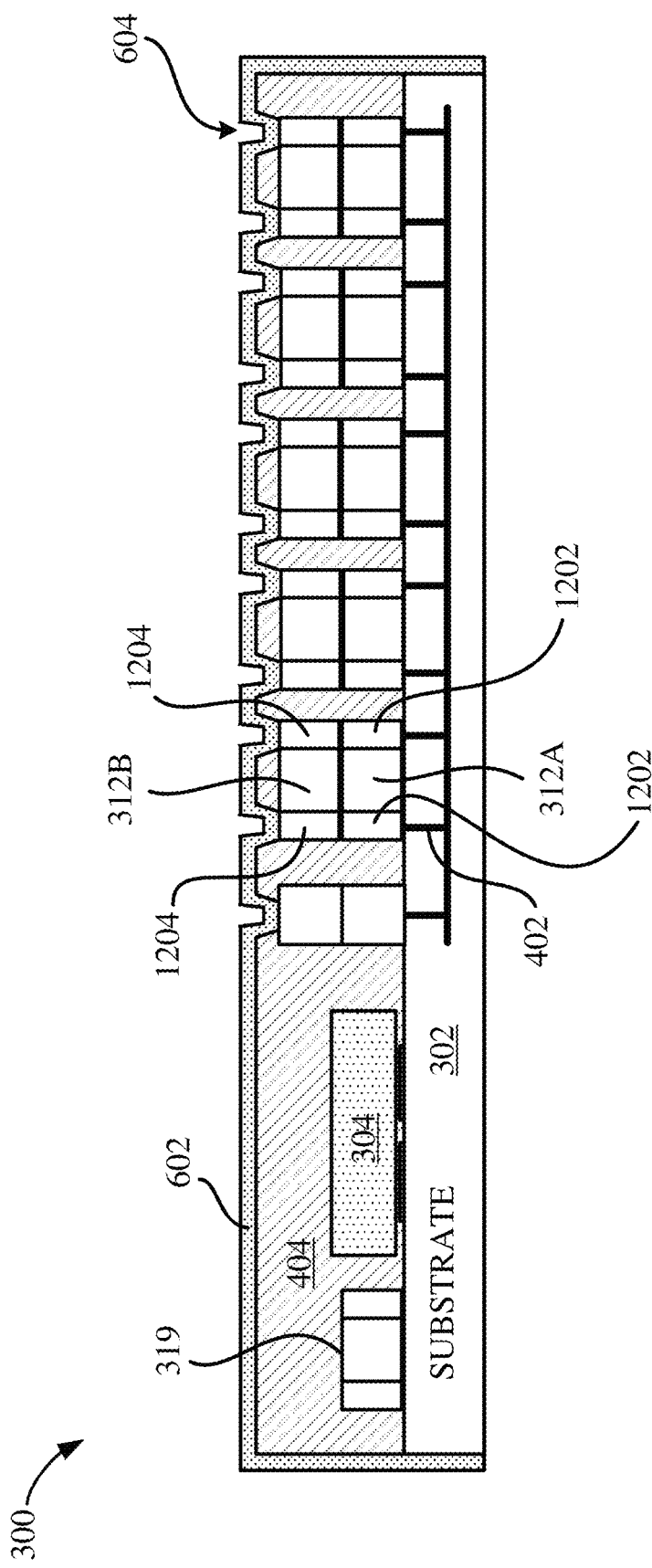
FIG. 12 illustrates a profile view of the package in FIG. 3 according to an embodiment with multiple passive devices stacked on other passive devices to form an EMI shield.

In one or more embodiments, a passive device 312 may be coupled to and located over (e.g., on top of) another passive device 312. FIG. 12 is a profile view of a package 300 where a passive device 312 is coupled to and located over another passive device 312. As shown, a first passive device 312A is coupled to and located over the first surface of the substrate 302, and a second passive device 312B is coupled to and located over the first passive device 312A such that the first passive device 312A is located between the substrate 302 and the second passive device 312B. In the depicted configuration, the conductive contacts 1202 of the first passive device 312A are electrically coupled with the conductive contacts 1204 of the second passive device 312B, facilitating an electrical connection for the second passive device 312B to ground by means of the first passive device 312A being coupled to the interconnect 402. Additionally, in the depicted example, the conductive layer 602 is electrically connected with the second passive device 312B by openings 604 in the encapsulation layer 404. The passive device 312B may be coupled to the passive device 312A through at least one solder interconnect (not shown).

Figure 13:
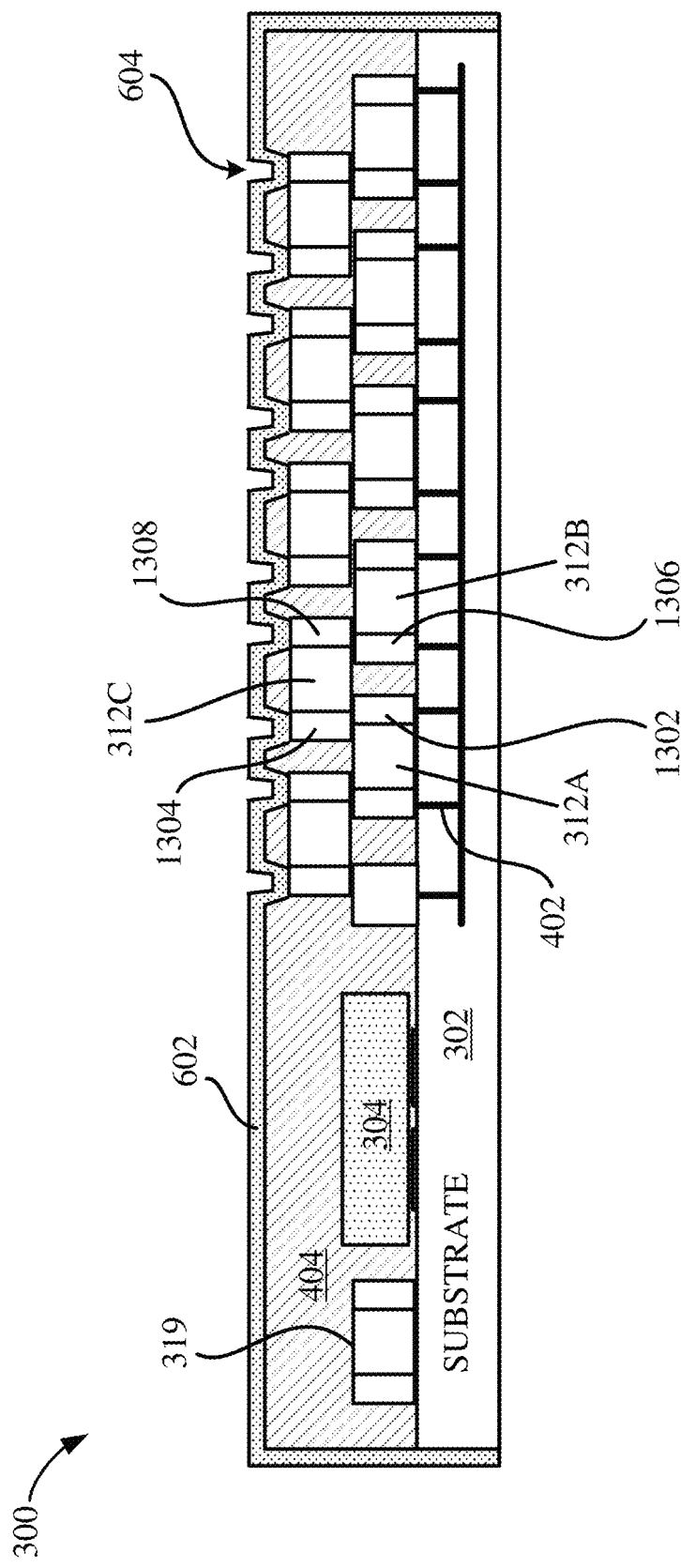
FIG. 13 illustrates a profile view of the package in FIG. 3 according to an embodiment with multiple passive devices stacked on other passive devices to form an EMI shield.

The example depicted in FIG. 12 shows one passive device 312 coupled to and located over one other passive device 312. In some embodiments, a passive device 312 may be coupled to and located over two other passive devices 312. FIG. 13 shows one examples of a configuration with a first passive device 312A and a second passive device 312B coupled to and located over the first surface of the substrate 302, and a third passive device 312C coupled to and located over both the first passive device 312A and the second passive device 312B. FIG. 13 may illustrate staggered passive devices stacked on top of each other. In this configuration, one conductive contact 1302 of the first passive device 312A is electrically coupled with a conductive contact 1304 of the third passive device 312C, and one conductive contact 1306 of the second passive device 312B is electrically coupled with another conductive contact 1308 of the third passive device 312C. These electrical couplings between conductive contacts facilitate an electrical connection for the third passive device 312C to ground by means of the first passive device 312A and the second passive device 312B being coupled to the interconnects 402. Additionally, in the depicted example, the conductive layer 602 is electrically coupled with the third passive device 312C by openings 604 in the encapsulation layer 404. The passive device 312C may be coupled to the passive device 312A and the passive device 312B through at least one solder interconnect (not shown).

Although the embodiments in FIGS. 12 and 13 show just two layers of stacked passive devices 312, it should be apparent that additional layers may also be formed by stacking additional passive devices 312 on top of the two layers shown in FIGS. 12 and 13. The number of stacked passive devices 312 may depend on a desired height for the EMI shield formed by the passive devices 312.

FIGS. 3-4 and 6-13 illustrate various implementations of packages that include at least one passive device configured as an EMI shield (e.g., means for EMI shielding through at least one passive device). The passive devices (e.g., 312) may be configured so as to subdivide the package(s) into several compartments that are configured to be isolated (e.g., EMI isolated) from other compartments of the packages. The passive devices (e.g., 312) may extend in the package and/or along the surface of the substrate in various directions, including along a length of the substrate, along a width of the substrate, and/or in a diagonal direction along the substrate. In some implementations, two or more of the passive devices that are configured to operate as EMI shield may be directly touching. The passive devices (e.g., 312) may be aligned laterally (e.g., along X-Y plane) and/or may be aligned vertically (e.g., along Z-direction) such that the passive devices may be considered as standing up. Passive devices (e.g., 312) that are used as EMI shield may be configured to be free of an electrically connection with other electrical components, such as integrated devices and/or dies.

Figure 14A:
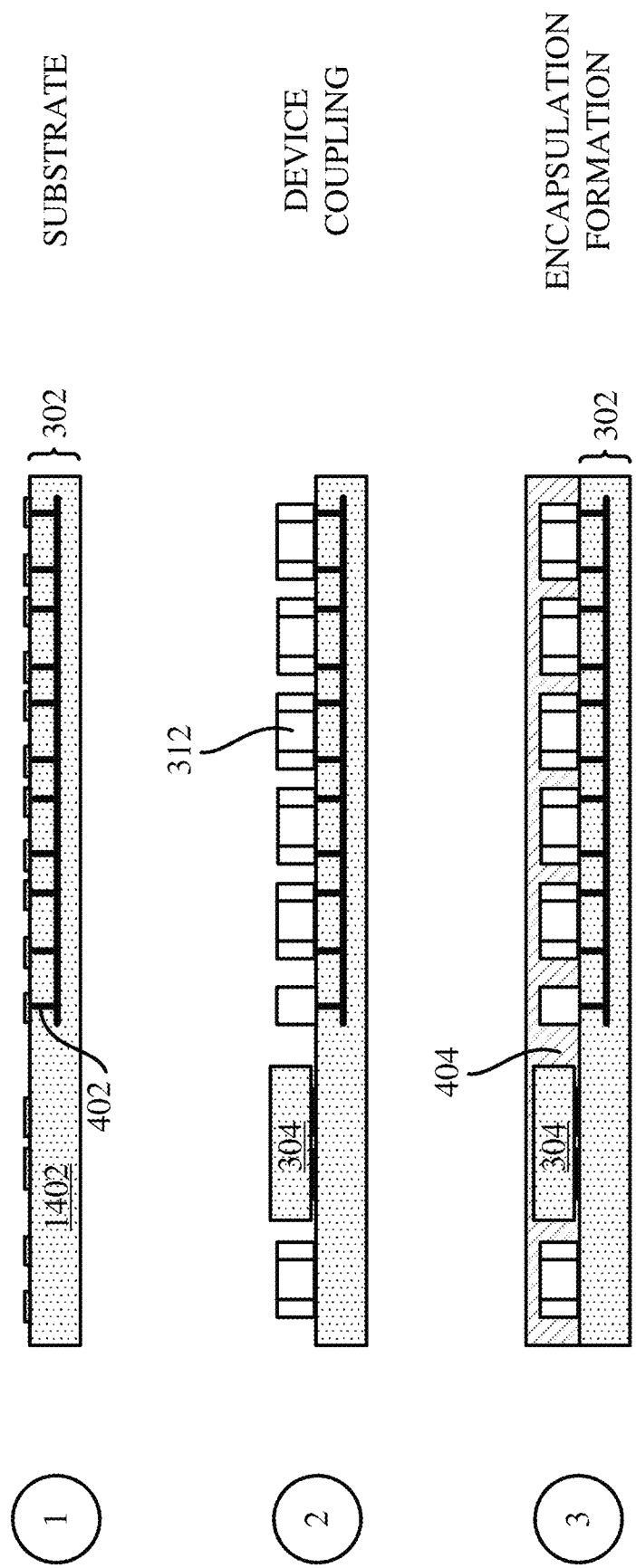
FIGS. 14A 14B illustrate an exemplary sequence for fabricating a package that includes an EMI shield.
Figure 14B:
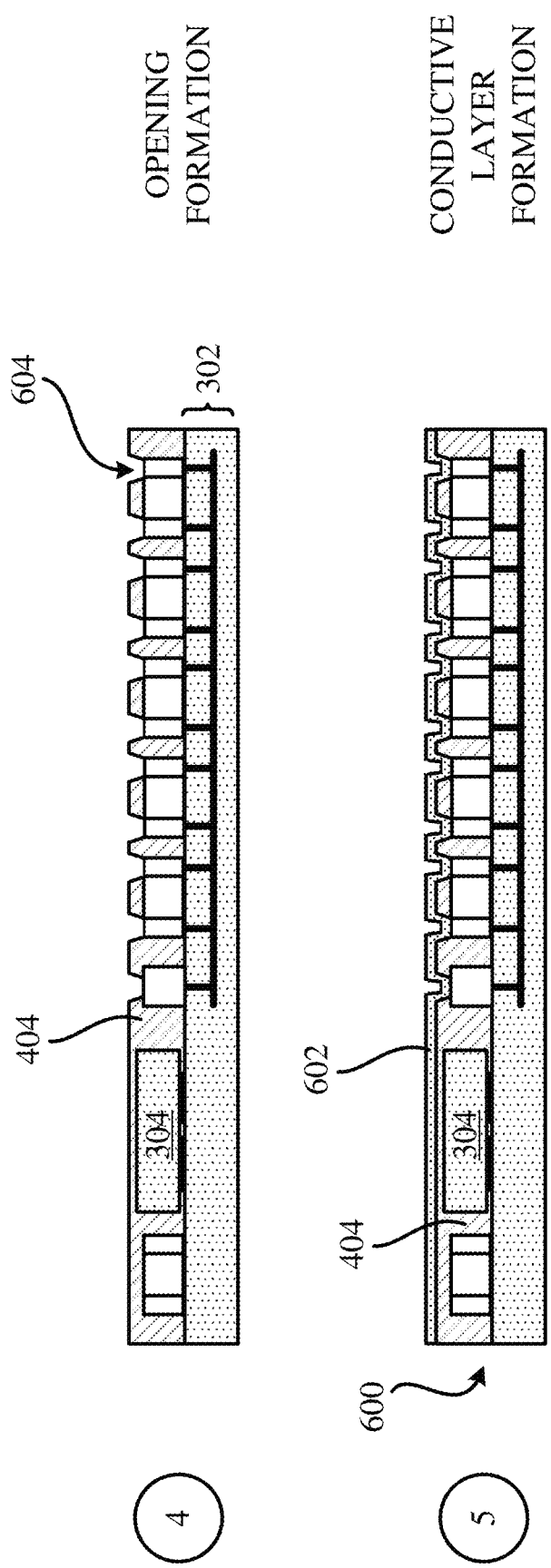

Exemplary Sequence for Fabricating a Package that Includes at Least One Passive Device Configured as an Electromagnetic Interference (EMI) Shield FIGS. 14A-14B illustrate an exemplary sequence for providing or fabricating a package that includes at least one passive device configured as an EMI shield. In some implementations, the sequence of FIGS. 14A-14B may be used to provide or fabricate the packages 300, 600, 700, 900, 1000 of FIGS. 3, 4, and/or 6-13, or any of the packages described in this disclosure.

It should be noted that the sequence of FIGS. 14A 14B may combine one or more stages in order to simplify and/or clarify the sequence for providing or fabricating the package. In some implementations, the order of the processes may be changed or modified. In some implementations, one or more of processes may be replaced or substituted without departing from the spirit of the disclosure. The sequence of FIGS. 14A 14B may be used to fabricate one package or several packages at a time (as part of a wafer).

Stage 1, as shown in FIG. 14A, illustrates a state after a substrate 302 is provided. The substrate 302 may be provided by a supplier or fabricated. Different implementations may use different processes to fabricate the substrate 302. Examples of processes that may be used to fabricate the substrate 302 include a semi-additive process (SAP) and a modified semi-additive process (mSAP). The substrate 302 includes at least one dielectric layer 1402, and a plurality of interconnects 402. The substrate 302 may be a laminate substrate, a coreless substrate, an organic substrate, a substrate that includes a core layer, etc.

Stage 2 illustrates a state after the electrical components (e.g., electrical component 304) and passive device(s) 312 are coupled to a first surface (e.g., top surface) of the substrate 302. The electrical component 304 and the passive device(s) 312 may be coupled to the plurality of interconnects 402 of the substrate 302 through a plurality of solder interconnects. In at least some examples, the passive device(s) 312 may be configured to be coupled to ground through the solder interconnects. A pick and place process may be used to place the electrical components and the passive device(s) on the substrate. A reflow solder process may be used to couple the electrical components and the passive device(s) through a plurality of solder interconnects. As described above with reference to FIGS. 12 and 13, coupling the passive device(s) 312 to the substrate 302 may include coupling one or more first passive devices 312 to the substrate 302, and coupling one or more additional passive devices 312 to at least some of the one or more first passive devices 312 coupled to the substrate 302. Moreover, passive devices that are not configured as an EMI shield may also be coupled to the substrate. Passive devices that are not configured as an EMI shield may be those passive devices that are part of an electronic circuit that includes the electrical component 304, while the passive devices that are configured as an EMI shield may be those passive devices that are not part of an electronic circuit including the electrical component 304. For example, passive devices that are configured as an EMI shield may be configured to be free of electrical coupling to active devices (e.g., transistors) of one or more electrical components (e.g., 304). That is, passive devices that are configured as an EMI shield may be configured to not be electrically coupled to active devices (e.g., transistors) of one or more electrical components (e.g., 304).

Stage 3 illustrates a state after the encapsulation layer 404 is formed over the first surface of the substrate 302 such that the encapsulation layer 404 encapsulates the electrical component (e.g., electrical component 304) and the passive devices 312. The process of forming and/or disposing the encapsulation layer 404 may include using a compression and transfer molding process, a sheet molding process, a film assisted molding process, or a liquid molding process. In at least some implementations, the encapsulation layer

404 may be formed and/or disposed using a film assisted molding process, resulting in a minimum mold clearance.

Stage 4, as shown in FIG. 14B, illustrates a state after openings 604 (e.g., cavities) are formed in the encapsulation layer 404. A drilling process may be used to form the openings 604, including etching (e.g., photoetching) and/or laser drilling (e.g., laser ablation). As depicted, an opening 604 may be formed to at least one conductive contact for each passive device 312 that forms a part of the EMI shield.

Stage 5 illustrates a state after a conductive layer 602 is formed over the encapsulation layer 404 and on the exposed portions of the one or more conductive contacts for at least some of the passive device 312 forming a part of the EMI shield. Different implementations may use different processes for forming the conductive layer 602. In some implementations, a chemical vapor deposition (CVD) process and/or a physical vapor deposition (PVD) process may be utilized for forming the conductive layer 602. In some implementations, a sputtering process, a spray coating process, and/or a plating process may be used to form the conductive layer 602. Stage 5 may illustrate the package 600 of FIG. 6.

Figure 15:
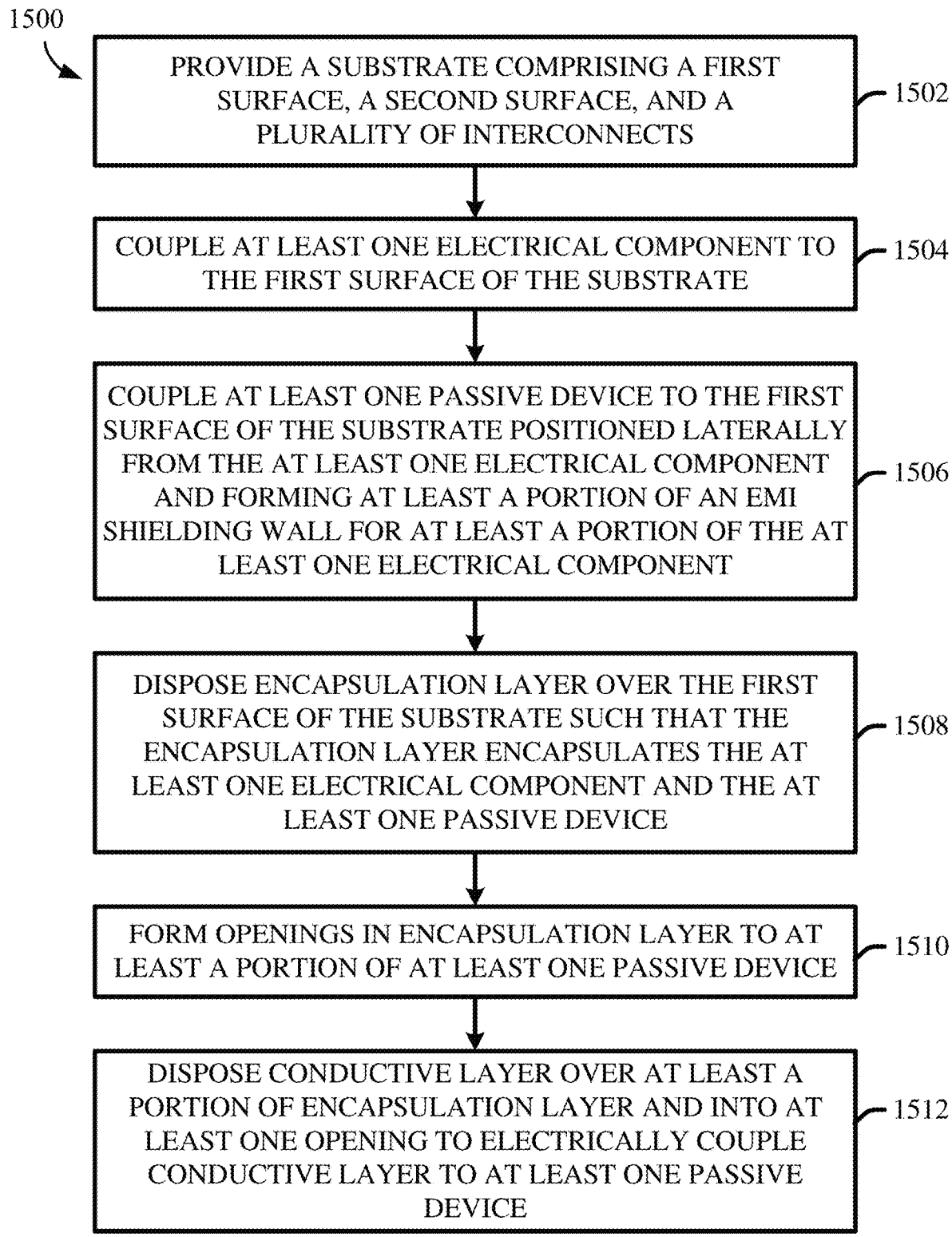
FIG. 15 illustrates an exemplary flow diagram of a method for fabricating a package that includes an EMI shield.

Exemplary Flow Diagram of a Method for Fabricating a Package that Includes at Least One Passive Device Configured as an Electromagnetic Interference (EMI) Shield In some implementations, fabricating a package that includes an EMI shielding includes several processes. FIG. 15 illustrates an exemplary flow diagram of a method 1500 for providing or fabricating a package that includes an EMI shield. In some implementations, the method 1500 of FIG. 15 may be used to provide or fabricate the packages 300, 600, 700, 900, 1000 of FIGS. 3, 4, and/or 6-13 described in this disclosure. However, the method 1500 may be used to provide or fabricate any of the packages described in the disclosure.

It should be noted that the method 1500 of FIG. 15 may combine one or more processes in order to simplify and/or clarify the method for providing or fabricating a package that includes an EMI shield formed from at least one passive device. In some implementations, the order of the processes may be changed or modified.

The method 1500 provides (at 1502) a substrate (e.g., 302). The substrate 302 may be provided by a supplier or fabricated. The substrate 302 includes a first surface and a second surface. The substrate 302 includes at least one dielectric layer 1402 and a plurality of interconnects 402. Different implementations may provide different substrates and different configurations of interconnects 402. Stage 1 of FIG. 14A illustrates and describes an example of providing a substrate.

The method 1500 couples (at 1504) one or more electrical components to at least one of the first surface or the second surface of the substrate 302. Different implementations may couple different electrical components and/or different numbers of electrical components. Electrical components may include an electrical component 304, 306, 308, 310, 1002, 1004. A pick and place process may be used to place the electrical components on the surface of the substrate. A reflow solder process may be used to couple the electrical component to the substrate through solder interconnects. Stage 2 of FIG. 14A, illustrates and describes examples of various electrical components being coupled to a surface of the substrate 302.

The method 1500 couples (at 1506) one or more passive devices 312 to the first surface of the substrate 302. The one or more passive devices 312 may be coupled to one or more interconnects 402 of the plurality of interconnects 402 on the first surface of the substrate 302. The one or more passive devices 312 may be located laterally relative to the one or more electrical components and form at least a portion of an EMI shield for at least a portion of the one or more electrical components. A pick and place process may be used to place the passive components on the surface of the substrate. A reflow solder process may be used to couple the passive components to the substrate through solder interconnects. Stage 2 of FIG. 14A, illustrates and describes examples of a plurality of passive devices 312 being coupled to a surface of the substrate 302. The one or more passive devices configured as an EMI shield may be placed on the substrate during the same process as placing other passive devices that are not configured as an EMI shield, which may reduce the number of steps in the fabrication process of the package.

Passive devices 312 may include any of the passive devices described above with reference to FIGS. 3-13. In at least some implementations of the method 1500, the one or more passive devices 312 may be a die configured as a resistor, or a resistor similar to the resistor 500 described herein with reference to FIG. 5. In one or more implementations, passive device 312 configured as a resistor may be a resistor configured with a resistance of 1,000 ohms (1 kilohm) or less, including a resistor indicated and/or rated as a zero-ohm resistor.

The passive devices 312 may be coupled to the first surface of the substrate 302 in various manners, including those depicted and described herein with reference to FIGS. 3, 4, 6-9, 12, and 13. For example, one or more passive devices 312 may be located adjacent to the substrate 302 with one or all conductive contacts (e.g., terminals) coupled to an interconnect, as described herein with reference to FIGS. 3, 4, and 6-9. In some embodiments, one or more passive devices 312 may be stacked on top of each other, as described with reference to FIGS. 12 and 13.

The method disposes (at 1508) an encapsulation layer (e.g., 404) over the first surface of the substrate 302 such that the encapsulation layer 404 encapsulates the electrical component(s) and the passive device(s) 312. The process of disposing and/or forming the encapsulation layer 404 may include using a compression and transfer molding process, a sheet molding process, a film assisted molding process, or a liquid molding process. In at least some implementations, a minimum mold clearance may be obtained by forming and/or disposing the conductive layer 602 using a film assisted molding process. Stage 3 of FIG. 14A illustrates and describes an example of an encapsulation layer that is located over and coupled to the substrate and encapsulates the electrical components and passive devices.

The method forms (at 1510) openings 604 (e.g., cavities) in the encapsulation layer 404. A drilling process may be used to form the openings 604, including etching (e.g., photoetching) and/or laser drilling (e.g., laser ablation). As depicted, an opening 604 may be formed to at least one conductive contact for each passive device 312 that forms a part of the EMI shield. Stage 4 of FIG. 14B illustrates and describes an example of openings 604 formed in the encapsulation layer 404.

The method disposes (at 1512) a conductive layer (e.g., 602) over at least a part of the encapsulation layer 404 and into one or more of the opening 604 to electrically couple the conductive layer 602 to one or more conductive contacts (e.g., terminals) of one or more passive devices 312. Different implementations may use different processes for disposing the conductive layer 602. In some implementations, a chemical vapor deposition (CVD) process and/or a physical vapor deposition (PVD) process may be employed for forming the conductive layer 602. In some implementations, a sputtering process, a spray coating process, and/or a plating process may be used to form the conductive layer 602. Stage 5 of FIG. 14B illustrates and describes an example of forming the conductive layer 602.

Exemplary Electronic Devices

Figure 16:
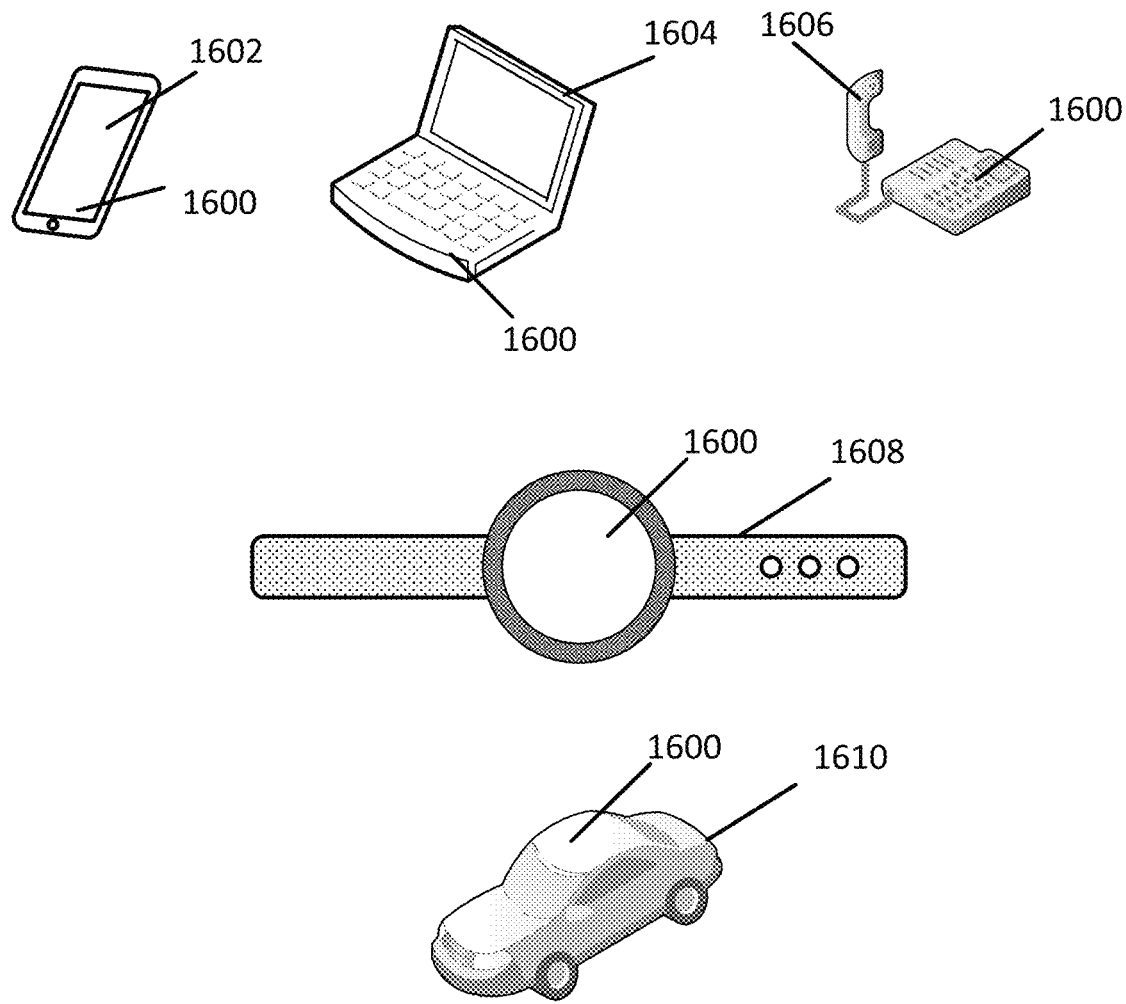
FIG. 16 illustrates various electronic devices that may integrate a die, an electronic circuit, an integrated device, an integrated passive device (IPD), a passive component, a package, and/or a device package described herein.

FIG. 16 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1602, a laptop computer device 1604, a fixed location terminal device 1606, a wearable device 1608, or automotive vehicle 1610 may include a device 1600 as described herein. The device 1600 may be, for example, any of the devices and/or integrated circuit (IC) packages described herein. The devices 1602, 1604, 1606 and 1608 and the vehicle 1610 illustrated in FIG. 16 are merely exemplary. Other electronic devices may also feature the device 1600 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

The various features described herein may include additional aspects, such as any single aspect or any combination of aspects described below and/or in connection with one or more other processes described elsewhere herein.

In a first aspect, a package may include a substrate comprising a first surface and a second surface opposite to the first surface, at least one electrical component coupled to the first surface of the substrate, and a plurality of passive devices coupled to the first surface of the substrate and located laterally to the at least one electrical component, wherein the plurality of passive devices forms an EMI shield. A plurality of passive devices may be located laterally around at least a portion of the at least one electrical component. Another plurality of passive devices may be coupled to the plurality of passive devices, wherein the plurality of passive devices is located between the substrate and the other plurality of passive devices. At least one of the plurality of passive devices may be configured as a resistor comprising a resistance rating of 1,000 ohms or less. At least one resistor may include a body with a first longitudinal end and an opposing second longitudinal end, a first conductive contact coupled to the first longitudinal end of the body, a second conductive contact coupled to the second longitudinal end of the body, and a resistive element extending between, and electrically coupled to the first conductive contact and the second conductive contact. At least one of the plurality of passive devices may be configured as a die configured as a resistor comprising a resistance rating of 1,000 ohms or less. An encapsulation layer may be disposed over the at least one electrical component and the plurality of passive devices. A conductive layer may be disposed over at least a portion of the encapsulation layer, the conductive layer electrically coupled to the plurality of passive devices. At least one additional electrical component may be coupled to the second surface of the substrate, and another plurality of passive devices may be coupled to the second surface of the substrate and located laterally around at least a portion of the at least one additional electrical component, wherein the other plurality of passive devices forms another EMI shield around at least a portion of the at least one additional electrical component coupled to the second surface of the substrate. The EMI shield may be configured as at least one of a compartment EMI shield and/or an edge EMI shield. Each of the plurality of passive devices may be configured to be coupled to ground through at least one interconnect.

In a second aspect, an apparatus may include a substrate comprising a first surface and a second surface opposite the first surface, at least one electrical component coupled to the first surface of the substrate, and means for EMI shielding through at least one passive device, wherein the at least one passive device is coupled to the first surface of the substrate, and wherein the at least one passive device is located laterally to the at least one electrical component. At least one second passive device may be coupled to the at least one passive device, where the at least one passive device is located between the substrate and the at least one second passive device. At least one second passive device may be staggered relative to the at least one passive device. The at least one passive device may be configured as a resistor comprising a resistance rating of 1 kilohm or less. The resistor may include a body comprising a first longitudinal end and an opposing second longitudinal end, a first conductive contact located adjacent to the first longitudinal end of the body, a second conductive contact located adjacent to the second longitudinal end of the body, and a resistive element extending between, and electrically coupled to the first conductive contact and the second conductive contact. The at least one passive device may be configured as a die configured as a resistor comprising a resistance rating of 1 kilohm or less. The apparatus may include means for encapsulation disposed over the at least one electrical component. A conductive layer may be disposed over at least a portion of the means for encapsulation, the conductive layer electrically coupled to the at least one passive device, wherein the at least one passive device is configured as a compartmental EMI shield for a package, and wherein the conductive layer is configured as a conformal EMI shield for the package. At least one electrical component may be coupled to the second surface of the substrate, and means for second EMI shielding through at least one second passive device, wherein the at least one second passive device is coupled to the second surface of the substrate and laterally surrounds at least a portion of the at least one electrical component coupled to the second surface of the substrate. The means for EMI shielding may be configured as at least one of a compartmental EMI shield and/or an edge EMI shield. The at least one passive device may be located laterally around at least a portion of the at least one electrical component. The at least one passive device may be configured to be coupled to ground through at least one interconnect.

In a third aspect, a method for fabricating a package may include providing a substrate comprising a first surface, an opposing second surface, and a plurality of interconnects, coupling at least one electrical component to one or more interconnects of the plurality of interconnects of the substrate, and coupling at least one passive device to one or more interconnects of the plurality of interconnects of the substrate, wherein the at least one passive device is configured to form at least a portion of an EMI shield. The coupling of at least one passive device to one or more interconnects of the plurality of interconnects of the substrate may include coupling a plurality of passive devices to respective interconnects of the plurality of interconnects over a first surface of the substrate. The coupling of at least one passive device to one or more interconnects of the plurality of interconnects of the substrate may include coupling at least a first passive device to one or more interconnects of the plurality of interconnects, and coupling at least a second passive device on at least a portion of the at least first passive device, wherein the at least first passive device is located between the substrate and the at least second passive device. The coupling of at least one passive device to one or more interconnects of the plurality of interconnects of the substrate may include coupling at least one passive device configured as a resistor comprising a resistance rating of 1,000 ohms or less. The coupling of at least one passive device to one or more interconnects of the plurality of interconnects of the substrate may include coupling at least one die configured as a resistor comprising a resistance rating of 1,000 ohms or less. At least one electrical component may be coupled to one or more interconnects over the second surface of the substrate, and at least one additional passive device may be coupled to one or more interconnects over the second surface of the substrate, the at least one additional passive device forming at least a portion of a second EMI shield for at least a portion of the at least one electrical component over the second surface of the substrate.

One or more of the components, processes, features, and/or functions illustrated in FIGS. 3-13, 14A-14B, and/or 15-16 may be rearranged and/or combined into a single component, process, feature or function or embodied in several components, processes, or functions. Additional elements, components, processes, and/or functions may also be added without departing from the disclosure. It should also be noted FIGS. 3-13, 14A-14B, and/or 15-16 and its corresponding description in the present disclosure is not limited to dies and/or ICs. In some implementations, FIGS. 3-13, 14A-14B, and/or 15-16 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The term "encapsulating" means that the object may partially encapsulate or completely encapsulate another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a current (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features associate with the examples described herein and shown in the accompanying drawings can be implemented in different examples and implementations without departing from the scope of the present disclosure. Therefore, although certain specific constructions and arrangements have been described and shown in the accompanying drawings, such embodiments are merely illustrative and not restrictive of the scope of the disclosure, since various other additions and modifications to, and deletions from, the described embodiments will be apparent to one of ordinary skill in the art. Thus, the scope of the disclosure is only determined by the literal language, and legal equivalents, of the claims which follow.

The invention claimed is:

1. A package comprising:
   a substrate comprising a first surface and a second surface opposite to the first surface;
   a first electrical component and a second electrical component, wherein each of the first electrical component and the second electrical component are coupled to the first surface of the substrate; and
   a plurality of passive devices coupled to the first surface of the substrate and located between the first electrical component and the second electrical component, wherein the plurality of passive devices collectively form an electromagnetic interference (EMI) shield configured to prevent signals from the first electrical component from interfering with the second electrical component.

2. The package of claim 1, further comprising a second plurality of passive devices coupled to the plurality of passive devices, wherein the plurality of passive devices are located between the substrate and the second plurality of passive devices.

3. The package of claim 1, wherein at least one of the plurality of passive devices is configured as a resistor comprising a resistance rating of 1,000 ohms or less.

4. The package of claim 3, wherein the resistor comprises:
   a body with a first longitudinal end and an opposing second longitudinal end;
   a first conductive contact coupled to the first longitudinal end of the body;
   a second conductive contact coupled to the second longitudinal end of the body; and
   a resistive element extending between, and electrically coupled to the first conductive contact and the second conductive contact.

5. The package of claim 1, further comprising an encapsulation layer disposed over the first electrical component, the second electrical component, and the plurality of passive devices.

6. The package of claim 5, further comprising a conductive layer disposed over at least a portion of the encapsulation layer, the conductive layer electrically coupled to the plurality of passive devices.

7. The package of claim 1, further comprising:
   at least one additional electrical component coupled to the second surface of the substrate; and
   a second plurality of passive devices coupled to the second surface of the substrate and located laterally around at least a portion of the at least one additional electrical component, wherein the second plurality of passive devices forms another EMI shield around the at least a portion of the at least one additional electrical component coupled to the second surface of the substrate.

8. The package of claim 1, wherein the EMI shield is configured as at least one of a compartment EMI shield and/or an edge EMI shield.

9. The package of claim 1, wherein each of the plurality of passive devices is configured to be coupled to ground through at least one interconnect.

10. An apparatus comprising:
    a substrate comprising a first surface and a second surface opposite the first surface;
    a first electrical component and a second electrical component, wherein each of the first electrical component and the second electrical component are coupled to the first surface of the substrate; and
    means for electromagnetic interference (EMI) shielding through a plurality of passive devices, wherein the plurality of passive devices collectively form an EMI shield between the first electrical component and the second electrical component, and
    wherein the plurality of passive devices are coupled to the first surface of the substrate.

11. The apparatus of claim 10, wherein a first passive device of the plurality of passive devices is coupled to a second passive device of the plurality of passive devices, and wherein the first passive device is located between the substrate and the second passive device.

12. The apparatus of claim 11, wherein the first passive device is staggered relative to the second passive device.

13. The apparatus of claim 10, wherein at least one of the plurality of passive devices is configured as a resistor comprising a resistance rating of 1 kilohm or less.

14. The apparatus of claim 13, wherein the resistor comprises:
    a body comprising a first longitudinal end and an opposing second longitudinal end;
    a first conductive contact located adjacent to the first longitudinal end of the body;
    a second conductive contact located adjacent to the second longitudinal end of the body; and
    a resistive element extending between, and electrically coupled to the first conductive contact and the second conductive contact.

15. The apparatus of claim 10, further comprising means for encapsulation disposed over the first electrical component and the second electrical component.

16. The apparatus of claim 15, further comprising a conductive layer disposed over at least a portion of the means for encapsulation, the conductive layer electrically coupled to the plurality of passive devices,
    wherein the conductive layer is configured as a conformal EMI shield for the apparatus.

17. The apparatus of claim 10 further comprising:
    at least one additional electrical component coupled to the second surface of the substrate; and
    means for second EMI shielding through a second plurality of passive devices, wherein the second plurality of passive devices are coupled to the second surface of the substrate and laterally surround at least a portion of the at least one additional electrical component coupled to the second surface of the substrate.

18. The apparatus of claim 10, wherein the means for EMI shielding is configured as at least one of a compartmental EMI shield and/or an edge EMI shield.

19. The apparatus of claim 10, wherein at least one of the plurality of passive devices is configured to be coupled to ground through at least one interconnect.

20. A method for fabricating a package, comprising:
    providing a substrate comprising a first surface, an opposing second surface, and a plurality of interconnects;
    coupling a first electrical component to one or more interconnects of the plurality of interconnects of the substrate;
    coupling a second electrical component to the one or more interconnects of the plurality of interconnects of the substrate; and
    coupling a plurality of passive devices to the substrate, wherein the plurality of passive devices are configured to form an electromagnetic interference (EMI) shield between the first electrical component and the second electrical component.

21. The method of claim 20, wherein the coupling of the plurality of passive devices to the substrate comprises:
- coupling the plurality of passive devices to respective interconnects of the plurality of interconnects over a first surface of the substrate.

22. The method of claim 20, wherein the coupling of the plurality of passive devices to the substrate comprises:
- coupling at least a first passive device of the plurality of passive devices to the one or more interconnects of the plurality of interconnects; and
- coupling at least a second passive device of the plurality of passive devices onto at least a portion of the at least first passive device, wherein the at least first passive device is located between the substrate and the at least second passive device.

23. The method of claim 20, wherein the coupling of the plurality of passive devices to the substrate comprises:
- coupling at least one passive device of the plurality of passive devices to the one or more interconnects of the plurality of interconnects of the substrate, wherein the at least one passive device is configured as a resistor comprising a resistance rating of 1,000 ohms or less.

24. The method of claim 20, further comprising:
- coupling at least one additional electrical component to the one or more interconnects over the second surface of the substrate; and
- coupling at least one additional passive device to the one or more interconnects over the second surface of the substrate, the at least one additional passive device forming at least a portion of a second EMI shield for at least a portion of the at least one electrical additional component over the second surface of the substrate.

\* \* \* \* \*